United States Patent [19]

Kamayachi et al.

[11] Patent Number: 5,009,982
[45] Date of Patent: Apr. 23, 1991

[54] RESIST INK COMPOSITION

[75] Inventors: Yuichi Kamayachi, Wako; Syoji Inagaki, Sakado, both of Japan

[73] Assignee: Taiyo Ink Manufacturing Co., Ltd., Tokyo, Japan

[21] Appl. No.: 204,927

[22] Filed: Jun. 6, 1988

Related U.S. Application Data

[63] Continuation of Ser. No. 850,220, Apr. 10, 1986, abandoned.

[30] Foreign Application Priority Data

Apr. 19, 1985 [JP] Japan ................. 60-084987

[51] Int. Cl.$^5$ ................. G03F 7/031; G03F 7/032; C08L 63/10; C08G 59/02
[52] U.S. Cl. ................. 430/280; 430/285; 430/287; 522/14; 522/16; 522/26; 522/28; 522/81; 522/83; 522/100; 522/101; 522/103; 525/482; 525/922
[58] Field of Search ............... 430/285, 280; 522/100, 522/103, 101

[56] References Cited

U.S. PATENT DOCUMENTS

| | | | |
|---|---|---|---|
| 3,980,483 | 9/1976 | Nishikubo | 522/103 |
| 4,101,398 | 7/1978 | Hesse | 522/103 |
| 4,105,518 | 8/1978 | McGinniss | 522/100 |
| 4,162,274 | 7/1979 | Rosenkranz | 522/100 |
| 4,358,477 | 11/1982 | Noomen | 522/100 |
| 4,428,807 | 1/1984 | Lee | 522/103 |
| 4,479,983 | 10/1984 | Appelt | 522/103 |

Primary Examiner—Marion E. McCamish
Assistant Examiner—Arthur H. Koeckert
Attorney, Agent, or Firm—Frost & Jacobs

[57] ABSTRACT

A photosetting liquid ink composition developable with a dilute alkaline aqueous solution and comprising (A) a resin curable with an activated energy ray, obtained by the reaction of a saturated or unsaturated polybasic acid anhydride with a product of the reaction of a novolak type epoxy compound and an unsaturated monocarboxylic acid, (B) a photopolymerization initiator, and (C) a diluent can be used for the production of an etching resist or a solder resist in the manufacture of a printed circuit. This composition, when combined with a thermosetting component, produces a photosetting and thermosetting liquid ink composition.

15 Claims, 1 Drawing Sheet

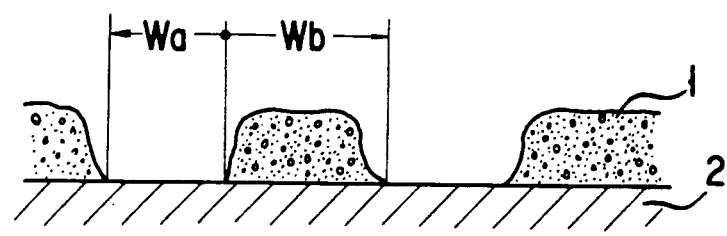

RESIST INK COMPOSITION

This is a continuation of application Ser. No. 850,220 filed Apr. 10, 1986, now abandoned.

BACKGROUND OF THE INVENTION

1. Field of the Invention

This invention relates to a novel and useful resist ink composition, and more particularly relates to a liquid resist ink composition developable with an alkaline aqueous solution, which excels in a photosetting property, resistance to heat, resistance to solvents, and resistance to acids and particularly suits the production of printed circuits boards for household appliances and printed circuit boards for industrial appliances.

2. Description of the Prior Art

Heretofore, as means of forming resist patterns on various printed circuit boards for household and industrial appliances, the screen printing method has been prevalently adopted. The screen printing method by nature has low resolution. When screen printing is carried out with a screen printing ink of relatively high viscosity, such adverse phenomena as breaks, screen marks, and pinholes occur in the produced patterns. When screen printing is carried out with a screen printing ink of relatively low viscosity, such adverse phenomena as breeds, smudges, and sags ensue. Because of these defects, the screen printing can no longer keep abreast with the recent trend of printed circuit boards toward increasing density.

To solve these problems, dry film type photoresists and liquid developable resist inks have been devised. To cite an example of dry film type photoresists, a dry film grade photo-sensitive resin composition which comprises urethane di(meth)acrylate, a linear high molecular compound possessing a glass transition point in a specific range, and a sensitizer is disclosed in the specification of Japanese Patent Application Laid-open SHO 57(1982)-55,914. Generally a photoresist of the dry film type, however, tends to produce bubbles during thermocompression bonding, betrays imperfection in thermal resistance and fast adhesiveness, and poses problems such as high price. To cite examples of liquid developable resist inks, UK Patent Application GB 2032939 A published May 14, 1980 discloses photopolymerizable coating compositions which comprise a solid or semi-solid reaction product of a polyepoxide and an ethylenically unsaturated carboxylic acid, an inert inorganic filler, a photopolymerization initiator, and a volatile organic solvent. The specification of Japanese Patent Application Laid-open SHO 58(1983)-62,636 (corresponding to Swiss Patent Application No. 6007/81-1 filed September 17, 1981) discloses a coating composition having a fine granular filler dispersed in a solution of a photosensitive epoxy resin mixed with a curing agent and possessing a viscosity in the range of 200 to 700 mPas so as to suit the curtain coating method. Since the liquid resist inks disclosed in the patent literatures mentioned above and currently offered in the market require use of organic solvents as their developing agents, they pose a problem of air pollution and, besides a problem of expensive solvents, suffer from imperfection in resistance to solvents and resistance to acids. A method which uses an alkaline aqueous solution as a developing liquid in the place of an organic solvent is disclosed in the specification of Japanese Patent Application SHO 57(1982) 164,595 (corresponding to U.S. Ser. No. 225810 filed January 16, 1981). The method for the production of a printed circuit disclosed by this patent literature, unlike the conventional method which produces a film by applying a liquid polymer on a circuit blank and drying the applied liquid polymer, is a unique method which comprises causing the applied liquid polymer in its undried state to be exposed to light through a given resist pattern and cured in that pattern and then removing the uncured liquid polymer. Since this method uses a liquid prepolymer containing many reactive monomers, it is inferior to the conventional film-forming method in such characteristics as resistance to acids and resistance to chemicals. Further, since this method does not form a film by drying, it requires to keep the surface of the applied liquid polymer at a distance from the resist pattern film. This separation impairs the resolution and necessitates provision of a special device and a consequent addition to the cost of production. The disclosures of the various patent applications mentioned above are incorporated herein for the sake of reference.

SUMMARY OF THE INVENTION

A primary object of this invention is to provide a liquid photosetting resist ink composition developable with an alkaline aqueous solution, which overcomes the drawbacks mentioned above.

Another object of this invention is to provide a photosetting liquid resist ink composition which is developable with a dilute alkaline aqueous solution and capable of forming on a circuit blank a resist coating which excels in adhesiveness, hardness, resistance to solvents, and resistance to acids.

Still another object of this invention is to provide a liquid resist ink composition which is developable with a dilute alkaline aqueous solution, capable of producing a cured coating excelling in not only the characteristic properties mentioned above but also various other properties such as electrical properties, resistance to heat, and resistance to plating, and therefore suitable for the production of printed circuit boards for household appliances and printed circuit boards for industrial appliances.

A further object of this invention is to provide a photosetting, thermosetting liquid resist ink composition which is developable with a dilute alkaline aqueous solution and capable of forming a cured coating possessing the outstanding properties mentioned above.

To accomplish the objects described above in accordance with this invention, there is provided a liquid resist ink composition developable with a dilute alkaline aqueous solution, which comprises:

(A) a resin curable with an activated energy ray, obtained by the reaction of a saturated or unsaturated polybasic acid anhydride upon a reaction product of novolak type epoxy compound and an unsaturated monocarboxylic acid, (B) a photopolymerization initiator, and (C) a diluent.

Further in accordance with this invention, there is provided a photosetting and thermosetting liquid resist ink composition developable with a dilute alkaline aqueous solution, which comprises in combination: a photosetting resin composition comprising:

(A) a resin curable with an activated energy ray, obtained by the reaction of a saturated or unsaturated polybasic acid anhydride upon a reaction product of novolak type epoxy compound and an unsaturated monocarboxylic acid, (B) a photopolymerization initiator, and (C) a diluent, and a thermosetting component.

The above and many other advantages, features and additional objects of the present invention will become apparent to those skilled in the art upon making reference to the following detailed description.

BRIEF DESCRIPTION OF THE DRAWING

The drawing is a schematic cross section illustrating a printed circuit on which a resist coating has been formed in consequence of exposure and development.

DETAILED DESCRIPTION OF THE INVENTION

The aforementioned resin (A) curable by an activated energy ray is obtained by causing a reaction product of such a novolak type epoxy compound as described afterward and an unsaturated monocarboxylic acid to react with a dibasic acid anhydride such as phthalic anhydride or an aromatic polycarboxylic acid anhydride such as trimellitic acid anhydride or pyromellitic acid anhydride. In this case, the resin proves particularly suitable when, in the production thereof, the amount of the aforementioned acid anhydride used for the reaction exceeds 0.15 mol per each of the hydroxyl groups possessed by the reaction product of the novolak type epoxy compound and the unsaturated carboxylic acid.

The acid value of the resin (A) so obtained suitably falls in the range of 45 to 160 mg KOH/g, preferably 50 to 140 mg KOH/g. If the acid value is smaller than 45, the alkali solubility is insufficient. Conversely if the acid value is notably larger than 160, the resistance of the cured film to alkalis and the electric properties and other similar properties expected of the resist are inferior. Thus, a deviation from the range mentioned above has adverse effects.

When the number of ethylenically unsaturated bonds present in the molecular unit of the resin (A) curable by the activated energy ray is small, since the photosetting proceeds slowly, it is desirable to use a novolak type epoxy compound as a raw material. For the purpose of lowering the viscosity of the ink, it is permissible to use a bis-phenol A type epoxy compound instead.

The novolak type epoxy compounds are represented by phenol novolak type epoxy resins and cresol novolak type epoxy resins. Such a compound as is produced by causing epichlorohydrin to react with a pertinent novolak resin by the conventional method can be used.

Typical examples of unsaturated monocarboxylic acids include acrylic acid, methacrylic acid, crotonic acid, and cinnamic acid. Among other unsaturated monocarboxylic acids cited, acrylic acid proves particularly suitable.

Typical examples of the aforementioned acid anhdyride are dibasic acid anhydrides such as maleic anhydride, succinic anhydride, itaconic anhydride, phthalic anhydride, tetrahydrophthalic anhydride, hexahydrophthalic anhydride, methylhexahydrophthalic anhdyride, endomethylenetetrahydrophthalic anhydride, methyl-endomethylenetetrahydrophthalic anhydride, chlorendic anhydride, and methyltetrahydrophthalic anhydride; aroamtic polycarboxylic anhydrides such as trimellitic anhydride pyromellitic anhydride, and benzophenone-tetracarboxylic dianhydride; and polycarboxylic anhydride derivatives such as 5-(2,5-dioxotetrahydrofuryl)-3-methyl-3-cyclohexene-1,2-dicarboxylic anhydride.

Typical examples of the aforementioned photopolymerization initiator (B) include benzoin and alkyl ethers thereof such as benzoin, benzoin methyl ether, benzoin ethyl ether, and benzoin isopropyl ether; acetophenones such as acetophenone,2-2-dimethoxy-2-phenylacetophenone, 2,2-diethoxy-2-phenylacetophenone, 1,1-dichloroacetophenone, 1-hydroxycyclohexyl-phenylketone, and 2-methyl-1-(4-(methylthio)phenyl-2-morpholine-propan-1one; anthraquinones such as 2-methylanthraquinone, 2-ethylanthraquinone, 2-tertiary-butylanthraquinone, 1-chloroanthraquinone, and 2-amylanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethylketal and benzil dimethylketal; and benzophenones such as benzophenone or xanthones. The photo-polymerization initiator (B) can be used in combination with one or more well-known conventional photopolymerization accelerator of benzoic acid type and tertiary amine type. The amount of the photopolymerization inititator (B) to be used suitably falls in the range of 0.2 to 30 parts by weight, preferably 2 to 20 parts by weight, based on 100 parts by weight of the resin (A) curable by the activated energy ray.

As the diluent (C) mentioned above, a photopolymerizable monomer and/or an organic solvent can be used. Typical examples of photopolymerizable monomers include water-soluble monomers (C-1) such as 2-hydroxyethyl acrylate, 2-hydroxypropyl acrylate, N-vinylpyrrolidone, acryloyl morpholine, methoxytetraethylene glycol acrylate, methoxypolyethylene glycol acrylate, polyethylene glycol diacrylate, N,N-dimethyl acrylamide, N-methylol acrylamide, N,N-dimethylaminopropyl acrylamide, N,N-dimethylaminoethyl acrylate, N,N-dimethylaminopropyl acryalte, and melamine acrylate, and methacrylates corresponding to the acryaltes enumerated above and water-insoluble monomers (C-2) such as diethylene glycol diacrylate, triethylene glycol diacrylate, propylene glycol diacrylate, dipropylene glycol diacrylate, tripropylene glycol diacrylate, polypropylene glycol diacrylate, phenoxyethyl acrylate, tetrahydrofurfuryl acrylate, cyclohexyl acrylate, trimethylol propane diacrylate, trimethylol propane triacrylate, glycerindiglycidyl ether diacrylate, glycerin triglycidyl ether triacrylate, pentaerythritol triacryalte, pentaerythritol tetraacrylate, dipentaerythritol pentaacrylate, dipentaerythritol hexaacrylate, isoborneolyl acrylate, cyclopentadiene mono- or diacrylate, methacrylates corresponding to the acryaltes enumerated above, and mono-, di-, tri-, and higher polyesters of polybasic acids with hydroxyalkyl(meth)acrylates.

Examples of organic solvents (C-3) include ketones such as methylethyl ketone and cyclohexanone; aromatic hydrocarbons such as toluene and xylene; cellosolves such as cellosolve and butyl cellosolve; carbitols such as carbitol, butyl carbitol; and acetic esters such as ethyl acetate, butyl acetate, cellosolve acetate, butyl cellosolve acetate, carbitol acetate, and butyl carbitol acetate.

The diluents (C) enumerated above are used either singly or in the form of a mixture of two or more members. The amount of the diluent to be used suitably falls in the range of 30 to 300 parts by weight, preferably 50 to 200 parts by weight, based on 100 parts by weight of the resin (A) curable by the activated energy ray.

Here, the water-soluble monomer (C-1) and the water-insoluble monomer (C-2) are used for the purpose of diluting the aforementioned resin curable by the activated energy ray, rendering the produced composition easily applicable, and imparting photopolymerizability upon the composition. The solubility of the produced composition in the alkaline aqueous solution improves in proportion as the ratio of the water-soluble monomer (C-1) incorporated increases. If it is used in an extremely large amount, the completely cured resist material is deprived of its waterproofness. Thus, the additional use of the water-insoluble monomer (C-2) constitutes a beneficial means. If the amount of the water-insoluble monomer (C-2) to be additionally used is too large, the produced composition becomes sparingly soluble in the alkaline aqueous solution. Desirably, this amount is not more than 100% by weight based on the amount of the resin (A) curable by the activated energy ray. Particularly, ample use of a hydrophilic monomer brings about a satisfactory effect at no sacrifice of the properties described afterward.

The organic solvent (C-3) is used for the purpose of dissolving and diluting the resin (A) curable by the activated energy ray, allowing the resin to be applied in the form of a liquid, and enabling the applied layer of the liquid to form a film on drying.

The photosetting liquid resist ink composition of this invention obtained as described above may further incorporate therein, as occasion demands, a well-known conventional filler such as barium sulfate, siliconoxide, talc, clay, or calcium carbonate, a well-known conventional coloring pigment such as phthalocyanine blue, phthalocyanine green, titanium dioxide, or carbon black, a defoaming agent, an adhesiveness-imparting agent, a leveling agent, or some other additives, or a well-known conventional polymerization inhibitor such as hydroquinone, hydroquinone monomethyl ether, pyrogallol, tertiary butyl catechol, or phenothiazine.

A resist coating aimed at can be formed by applying a liquid resist ink composition essentially comprising a specific resin curable by an activated energy ray having a novolak resin as a backbone polymer thereof, a photopolymerization initiator, and a diluent on the entire surface of a printed-circuit substrate by the screen printing method, the roll coater method, or the curtain coating method, exposing the substrate to an activated energy ray thereby curing the necessary part thereof, and dissolving the unexposed part of the applied layer with a dilute alkaline aqueous solution.

In another aspect of this invention, a photosetting and thermosetting liquid resist ink composition developable with a dilute alkaline aqueous solution is obtained by combining the aforementioned photosetting resin composition comprising (A) a resin curable with an activated energy ray, (B) a photopolymerization initiator, and (C) a diluent, and optionally incorporating additionally therein a filler, a coloring pigment, a defoaming agent, a leveling agent, an adhesiveness-imparting agent, or a polymerization inhibitor, with a thermosetting component. To be specific, the thermosetting component comprises an epoxy compound having two or more epoxy groups in the molecular unit thereof such as, for example, a bis-phenol A type epoxy resin, a bis-phenol F type epoxy resin, a bis-phenol S type epoxy resin, a phenol-novolak type epoxy resin, a cresol-novolak type epoxy resin, a N-glycidyl type epoxy resin, or an alicyclic type epoxy resin and optionally incorporates additionally therein in a small amount for promotion of a reaction a well-known epoxy curing promoter such as, for example, an amine compound, an imidazole compound, a carboxylic acid, a phenol, a quaternary ammonium salt, or a methylol group-containing compound. When the composition is applied in a layer and the applied layer is then heated, the polymerization of the photosetting component is promoted and the copolymerization of the two components are facilitated so that the consequently produced resist coating acquires improvements in various properties such as resistance to heat, resistance to solvents, resistance to acids, resistance to plating, adhesiveness, electric properties, and hardness. The composition proves particularly useful for the formation of a solder resist. The aforementioned thermosetting component may be admixed with the photosetting resin composition in advance of actual use thereof. Since the mixture so formed is liable to increase viscosity while awaiting actual application on a circuit blank, it is desirable for the two components to be mixed immediately before the actual use. Further, the aforementioned filler, coloring pigment, etc. may be incorporated in the thermosetting component by being mixed with a solution of the thermosetting component in an organic solvent. The amount of the thermosetting component to be used falls in the range of 10 to 150 parts by weight, preferably 30 to 50 parts by weight, based on 100 parts by weight of the photo-setting resin composition. The aforementioned epoxy curing promoter is used in an amount of 1 to 20 parts by weight, based on 100 parts by weight of the thermosetting component (epoxy compound).

The resist ink composition of the present invention produces a resist coating which excels in photosetting property, adhesiveness, resistance to heat, resistance to solvents, resistance to acids, and resistance to plating. Moreover since it is developable with a dilute alkaline aqueous solution, it has no need for an organic solvent, a substance indispensable to the conventional liquid resist and, therefore, has no possibility of entailing the problem of pollution. As is clear from the test examples cited afterward, the thermosetting component-containing ink composition of the present invention which is developable with a dilute alkaline aqueous solution can be used not only in the form of etching resist but also in the form of solder resist on condition that a step for aftercuring with heat is additionally incorporated in the procedure. The solder resist so formed excels in curing property, adhesiveness, hardness, resistance to heat, resistance to solvents, resistance to plating, and electric properties.

Examples of light sources usable advantageously for the curing of the composition of this invention include low-pressure mercury vapor lamp, medium-pressure mercury vapor lamp, high-pressure mercury vapor lamp, ultrahigh-pressure mercury vapor lamp, xenon lamp, and metal halide lamp. Besides, a laser beam may be used as an activated energy ray during the exposure.

For more specific illustration of the present invention, the following examples are presented which are intended to be merely illustrative of and not in any sense limitative of the invention.

EXAMPLE 1

On a product of the reaction of 1 equivalent weight of a cresol-novolak type epoxy resin having an epoxy equivalent weight of 217 and possessing an average of 7 phenol ring residues and epoxy groups in one molecule thereof with 1.05 equivalent weight of acrylic acid, 0.67 equivalent weight of tetrahydrophthalic anhydride was caused to react by the conventional method, with phenoxyethyl acrylate as a solvent. The product of this reaction was a viscous liquid containing 35 parts by weight of phenoxyethyl acrylate As a mixture, it showed an acid value of 63.4 mg KOH/g. Hereinafter, this product will be referred to briefly as "resin (A-1)."

| Component (a) | |
|---|---|
| Resin (A-1) | 40 parts by weight |
| 2-Hydroxyethyl acrylate | 15 parts by weight |
| Benzildiethyl ketal | 2.5 parts by weight |
| 1-Benzyl-2-methyl imidazole | 1.0 parts by weight |
| "Modaflow" (leveling agent produced by Monsanto Chemical of the U.S.A.) | 1.0 parts by weight |
| Barium sulfate | 25 parts by weight |
| Phthalocyanine green | 0.5 parts by weight |
| Total of component (a) | 85 parts by weight |
| Component (b) | |
| Trimethylol propane triglycidyl ether | 15 parts by weight |

The component (a) shown above was kneaded in a test roll (roll mill) to prepare an ink. Then, the ink of this component (a) was mixed with the aforementioned component (b). The resulting mixture was applied with a curtain coater (made by Hiyama Manufacturing Co., Ltd.) on the entire surface of a copper-plated laminate consisting of a copper foil 35 μm in thickness and a glass epoxy substrate and of a printed circuit having a stated pattern formed thereon in advance by etchine, to prepare test pieces.

Hereinafter, the test piece obtained by coating the copper-plated laminate will be referred to briefly as Test piece No. 1-E and the test piece obtained by coating the printed circuit as Test piece No. 1-S.

EXAMPLE 2

| Component (a) | |
|---|---|
| Resin (A-1) | 30 parts by weight |
| N-vinyl pyrrolidone | 15 parts by weight |
| Trimethylol propane triacrylate | 10 parts by weight |
| 2-Ethyl anthraquinone | 2.0 parts by weight |
| 2,4-Diethyl thioxanthone | 1.5 parts by weight |
| 2-Phenyl-4-methyl-5-hydroxymethyl imidazole | 1.0 parts by weight |
| Phthalocyanine green | 0.5 parts by weight |
| "Modaflow" | 1.0 parts by weight |
| Calcium carbonate | 24 parts by weight |
| Total of component (a) | 85 parts by weight |
| Component (b) | |
| Epikote 828 (epoxy resin made by Shell Oil) | 7 parts by weight |
| Glycerin diglycidyl ether | 8 parts by weight |
| Total of component (b) | 15 parts by weight |

Test pieces were prepared by following the procedure of Example 1, except that the components indicated above were used instead. The test pieces will be referred to as Test piece No. 2-E and No. 2-S respectively.

EXAMPLE 3

On a product of the reaction of 1 equivalent weight of a phenol-novolak type epoxy resin having an epoxy equivalent weight of 178 and possessing an average of 3.6 phenyl ring residues and epoxy group in one molecule thereof with 0.95 equivalent weight of acrylic acid, 0.78 equivalent weight of hexahydrophthalic anhydride was caused to react by the conventional method, with diethylene glycol acrylate as a solvent. The product of this reaction was a viscous liquid containing 35 parts by weight of diethylene glycol diacrylate. As a mixture, it showed an acid value of 72.8 mg KOH/g. It will be referred to briefly as "resin (A-2)."

| Component (a) | |
|---|---|
| Resin (A-2) | 40 parts by weight |
| 2-Hydroxypropyl acrylate | 10 parts by weight |
| Pentaerythritol triacrylate | 10 parts by weight |
| 2-Ethyl anthraquinone | 2.0 parts by weight |
| 2-Dimethylaminoethyl benzoate | 1.5 parts by weight |
| "AC-300" (defoaming agent produced by Kyoeisha Yushi K.K.) | 1.0 parts by weight |
| Phthalocyanine green | 0.5 parts by weight |
| Talc | 20 parts by weight |
| Total of component (a) | 85 parts by weight |
| Component (b) | |
| Epikote 828 | 15 parts by weight |

An ink was prepared by kneading the component (a) shown above in a test roll (roll mill). Then, the component (a) and the component (b) was mixed. The resulting mixture was applied by the screen printing method on the entire surface of a copper-plated laminate and a printed circuit having a stated pattern formed by etching in advance to prepare test pieces. These test pieces will be referred to as Test piece No. 3-E and No. 3-S respectively.

EXAMPLE 4

On a product of the reaction of 1 equivalent weight of a cresol type epoxy resin having an epoxy equivalent weight of 217 and possessing an average of 7 phenol ring residues and epoxy group with 1.05 equivalent weight of acrylic acid, 0.95 equivalent weight of tetrahydrophthalic anhydride was caused to react by the conventional method. The product of the reaction was diluted with cellosolve acetate to an involatile content of 70%. The diluted product will be referred to as "resin (A-3)."

| Component (a) | |
|---|---|
| Resin (A-3) | 50 parts by weight |
| Trimethylol propane triacryalte | 4 parts by weight |
| Pentaerythritol triacrylate | 4 parts by weight |
| 2-Ethyl anthraquinone | 3 parts by weight |
| 2-Dimethylaminoethyl benzoate | 2 parts by weight |
| 2-Phenyl-4-benzyl-5-hydroxymethyl imidazole | 0.5 parts by weight |
| "AC-300" | 1.0 parts by weight |
| Phthalocyanine green | 0.5 parts by weight |
| Calcium carbonate | 10 parts by weight |
| Total of component (a) | 75 parts by weight |
| Component (b) | |
| "Epiclon EXA-1514" (bis-phenol S type epoxy resin made by Dai-Nippon Ink & Chemicals, Inc. | 10 parts by weight |
| Trimethylol propane triglycidyl ether | 4 parts by weight |
| Cellosolve acetate | 6 parts by weight |
| Calcium carbonate | 5 parts by weight |
| Total of component (b) | 25 parts by weight |

The components (a) and (b) indicated above were separately kneaded in a test roll (roll mill) to prepare inks.

Then the component (a) and the component (b) were mixed. The resulting mixture was applied by the screen printing method on the entire surface of a copper-plated laminate and of a printed circuit substrate having a stated pattern formed thereon by etching in advance and then dried in a hot-air circulation type drier oven at 70° C. for 30 minutes to produce test pieces. The test piece produced by applying the ink on the copper-plated laminate will be referred to as "Test piece 4-E" and the test piece produced by applying the ink on the printed circuit having the stated pattern formed by etching in advance as "Test piece 4-S."

EXAMPLE 5

| Component (a) | |
|---|---|
| Resin (A-3) | 50 parts by weight |
| "Aronics M-5400" (acryl monomer made by Toa Gosei Chemical Industry Co., Ltd. | 3 parts by weight |
| Tetramethylol methane tetraacrylate | 2.5 parts by weight |
| Benzoin isopropyl ether | 3 parts by weight |
| 1-Benzyl-2-methyl imidazole | 1.0 parts by weight |
| "AC-300" | 1.0 parts by weight |
| Phthalocyanine green | 0.5 parts by weight |
| Talc | 9 parts by weight |
| Total of component (a) | 70 parts by weight |
| Component (b) | |
| "Epikote 1001" | 15 parts by weight |
| Glycerin diglycidyl ether | 5 parts by weight |
| Butyl cellosolve | 6 parts by weight |
| Talc | 4 parts by weight |
| Total of component (b) | 30 parts by weight |

Inks were prepared and test pieces were produced by following the procedure of Example 4, except that the components indicated above were used instead. The test pieces thus obtained will be referred to as "Test piece No. 5-E and 5-S."

EXAMPLE 6

| Component (a) | |
|---|---|
| Resin (A-3) | 45 parts by weight |
| "M-310" (acryl monomer made by Toa Gosei Chemical Industry Co., Ltd.) | 3 parts by weight |
| "M-5400 (acryl monomer made by Toa Gosei Chemical Industry Co., Ltd.) | 3 parts by weight |
| Benzoin isopropyl ether | 3 parts by weight |
| 2-Dimethylaminoethyl benzoate | 1.5 parts by weight |
| 2-Phenyl imidazole | 1.0 parts by weight |
| "AC-300" | 1.0 parts by weight |
| Phthalocyanine green | 0.5 parts by weight |
| Cellosolve acetate | 7 parts by weight |
| Barium sulfate | 15 parts by weight |
| Total of component (a) | 80 parts by weight |
| Component (b) | |
| Epikote 828 | 10 parts by weight |
| Trimethylolpropane triglycidyl ether | 4 parts by weight |
| Barium sulfate | 6 parts by weight |
| Total of component (b) | 20 parts by weight |

Inks were prepared and test pieces were produced by following the procedure of Example 4, except that the components indicated above were used instead. The test pieces so produced will be referred to as "Test piece 6-E" and "Test piece 6-S."

EXAMPLE 7

| Component (a) | |
|---|---|
| Resin (A-3) | 50 parts by weight |
| Cellosolve acetate | 10 parts by weight |
| Benzil diethyl ketal | 3.0 parts by weight |
| 2-Ethyl-4-methyl imidazole | 0.5 parts by weight |
| "AC-300" | 1.0 parts by weight |
| Phthalocyanine green | 0.5 parts by weight |
| Talc | 20 parts by weight |
| Total of component (a) | 85 parts by weight |
| Component (b) | |
| Epikote 1001 | 10 parts by weight |
| Trimethylolpropane triglycidyl ether | 5 parts by weight |
| Total of component (b) | 15 parts by weight |

Inks were prepared and test pieces were produced by following the procedure of Example 4, except that the components indicated above were used instead. The test pieces will be referred to as "Test piece No. 7-E and No. 7-S."

EXAMPLE 8

| | |
|---|---|
| Resin (A-3) | 50 parts by weight |
| Trimethylol propane triacrylate | 5 parts by weight |
| Benzil diethyl ketal | 3 parts by weight |
| "AC-300" | 1.5 parts by weight |
| Phthalocyanine green | 0.5 parts by weight |
| Cellosolve acetate | 20 parts by weight |
| Talc | 20 parts by weight |
| Total | 100 parts by weight |

In a test roll (roll mill), the components indicated above were kneaded to prepare an ink. The resulting mixture was applied by the screen printing method on the entire surface of a copper-plated laminate and then dried in a hot-air circulation type drier oven at 70° C. for 30 minutes, to produce a test piece. This test piece will be referred to as "Test piece No. 8-E."

COMPARATIVE EXPERIMENT 1

| | |
|---|---|
| "NK ester EA-800" (bis-phenol A type epoxy acrylate resin made by Shin Nakamura Kagaku K.K.) | 40 parts by weight |
| Trimethylol propane triacrylate | 16 parts by weight |
| Isobutyl methacrylate | 20 parts by weight |
| "Darocure 1173" (photopolymerization initiator made by Merck) | 3.5 parts by weight |
| Barium sulfate | 20 parts by weight |
| Phthalocyanine green | 0.5 part by weight |
| total: | 100 parts by weight |

As an ink composition for control, the components indicated above were kneaded in a test roll (roll mill) to prepare an ink.

This ink was applied by the screen printing method on the entire surface of a copper-plated laminate and of a printed circuit having a stated pattern formed thereon by etching in advance, to produce test pieces. The test pieces will be referred to as "Comparison 1-E" and "Comparison 1-S."

COMPARATIVE EXPERIMENT 2

| | |
|---|---|
| "XP-4200" (urethane acrylate resin made by Nippon Synthetic Chemical Industry Co., Ltd.) | 35 parts by weight |
| Neopentyl glycol diacrylate | 20 parts by weight |
| 2-Hydroxypropyl methacrylate | 16 parts by weight |
| "Darocure 1173" | 3.5 parts by weight |
| Talc | 25 parts by weight |
| Phthalocyanine green | 0.5 parts by weight |

-continued

| | |
|---|---|
| Total: | 100 parts by weight |

Test pieces were produced by following the procedure of Comparative Experiment 1, except that the components indicated above were used for an ink composition for control. The test pieces will be referred to as "Comparison 2-E" and "Comparison 2-S."

COMPARATIVE EXPERIMENT 3

| | |
|---|---|
| "V-90" (bisphenol A type epoxy acrylate resin solid at room temperature made by Showa Highpolymer Co., Ltd.) | 50 parts by weight |
| Dipentaerythritol hexaacrylate | 5 parts by weight |
| Carbitol acetate | 40 parts by weight |
| Benzoin isopropyl ether | 3.5 parts by weight |
| Phthalocyanine green | 0.5 parts by weight |
| "AC-300" | 1.0 parts by weight |
| Total: | 100 parts by weight |

As an ink composition for control the components indicated above were kneaded in a test roll (roll mill) to prepare an ink.

Then, this ink was applied by the screen plating method on the entire surface of a copper-plated laminate and of a printed circuit having a stated pattern formed by etching an advance and then dried in a hot-air circulation type drier oven at 70° C. for 30 minutes the test pieces so produced will be referred to as "Comparison 3-E" and "Comparison 3-S."

COMPARATIVE EXPERIMENT 4

| | |
|---|---|
| "ZX-673" (novolak type epoxy acrylate resin solid at room temperature made by Toto Chemical Co., Ltd.) | 35 parts by weight |
| "ECN 1280" (cresol-novolak type epoxy resin produced by Ciba Geigy) | 8 parts by weight |
| Dipentaerythritol hexaacrylate | 6 parts by weight |
| Carbitol | 30 parts by weight |
| 2-Ethyl anthraquinone | 3.5 parts by weight |
| "AC-300" | 1.0 parts by weight |
| Phthalocyanine green | 0.5 parts by weight |
| 2-Ethyl-4-methyl imidazole | 1.0 parts by weight |
| Barium sulfate | 15 parts by weight |
| Total: | 100 parts by weight |

Test pieces were produced by following the procedure of Comparative Experiment 3, except that the components indicated above were used instead. The test pieces so produced will be referred to as "Comparison 4-E" and "Comparison 4-S." Test Examples 1-3 (Photosetting property, developability, and dryness by finger touch):

On each of the test pieces, 1-E through 8-E and Comparison 1-E through Comparison 4-E, obtained in Examples 1-8 and Comparative Experiments 1-4, a resist pattern film applied fast on glass was placed through the medium of a spacer 0.5 mm in thickness so as to be kept untouched, irradiated for a varying time with the light from a parallel exposure device (Model HMW- 590, made by Orc Manufacturing Co., Ltd.) to test for photosetting property. The resist pattern film, after being cured by the exposure, was developed with an aqueous 1% sodium carbonate solution as a developer to test for developability. The results are collectively shown in Table 1.

In the case of the test pieces from the comparative experiments, since they were not developable with an alkaline aqueous solution, they were developed with "Eterna IR" (modified 1,1,1-trichloroethane made by Asahi chemical Industry Co., Ltd.).

The test pieces produced in Examples 4-8 and Comparative Experiments 3-4 were tested for dryness with a finger tip. On each of these test pieces, a resist pattern film was attached fast directly, irradiated for a varying time with the light, and tested for photosetting property and developability. The results are also shown in Table 1.

TABLE 1

| Property | | | Example | | | | | | | | Comparative Experiment | | | |
|---|---|---|---|---|---|---|---|---|---|---|---|---|---|---|
| | | | 1-E | 2-E | 3-E | 4-E | 5-E | 6-E | 7-E | 8-E | C.1-E | C.2-E | C.3-E | C.4-E |
| Driness by finger tip | | | — | — | — | O | ◉ | Δ | ◉ | ◉ | — | — | Δ | Δ |
| Photosetting property | Exposure time to ultraviolet light (in seconds) | 30 | Δ | O | Δ | ◉ | ◉ | O | x | ◉ | x | x | x | x |
| | | 60 | O | ◉ | O | ◉ | ◉ | ◉ | Δ | ◉ | x | Δ | Δ | x |
| | | 90 | ◉ | ◉ | ◉ | ◉ | ◉ | ◉ | O | ◉ | Δ | Δ | O | Δ |
| | | 120 | ◉ | ◉ | ◉ | ◉ | ◉ | ◉ | ◉ | ◉ | Δ | O | O | Δ |
| | | 180 | ◉ | ◉ | ◉ | ◉ | ◉ | ◉ | ◉ | ◉ | O | O | O | O |
| | | 300 | O | ◉ | ◉ | ◉ | ◉ | ◉ | ◉ | ◉ | O | ◉ | ◉ | O |
| Developability* | Spray time (in seconds) | 30 | O | Δ | Δ | x | x | x | x | ◉ | Δ | x | x | x |
| | | 60 | ◉ | O | O | Δ | Δ | Δ | Δ | ◉ | O | Δ | Δ | x |
| | | 90 | ◉ | ◉ | O | O | O | O | O | ◉ | ◉ | O | O | Δ |
| | | 120 | ◉ | ◉ | ◉ | ◉ | ◉ | ◉ | ◉ | ◉ | ◉ | O | O | O |
| | | 180 | ◉ | ◉ | ◉ | ◉ | ◉ | ◉ | ◉ | ◉ | ◉ | ◉ | ◉ | O |

*The developing liquid was an aqueous 1% sodium carbonate solution in the case of examples and Eterna IR (modified 1,1,1-trichloroethane) in the case of comparative experiments.

The marks indicated in Table 1 as results of rating of properties are based on the following scales. Dryness by finger tip:

A given test piece was left standing in a constant temperature and constant humidity bath at 25° C. and 65% RH for 1 hour, touched with a finger tip to test for tack, and rated on the following four-point scale, wherein ⊚: Total absence of perceivable tack
o: Slightly perceivable tack
Δ: Conspicuously perceivable tack
x: Adhesion of ink to finger tip Photosetting property:

A given test piece was exposed to ultraviolet light, developed with a "dilute alkaline aqueous solution" as a developing liquid for 1 minute under the condition of spray pressure of 2 kg/cm$^2$, visually examined with respect to condition of coating, and rated on the following four-point scale, wherein ⊚: Total absence of discernible change
o: Slight change of surface Δ: Conspicuous change of surface
x: Complete separation of coating Developability:

A given test piece, while being developed under spray pressure of 2 kg/cm², was examined for developability under a microscope at stated intervals and rated by the following four-point scale, wherein ⊚: Complete development to fine portions
○: Occurrence of thin undeveloped portions on substrate surface
Δ: Heavy occurrence of undeveloped portions
x: Substantial absence of development

TEST EXAMPLE 4 (COATING PROPERTY)

The test pieces, 1-E through 8-E and Comparison 1-E through Comparison 4-E, produced by applying relevant inks on copper-plated laminates in Examples 1–8 and Comparative Experiments 1–4 were exposed to light and developed. Then, with an etching machine (made by Tokyo Kakoki K.K.), the test pieces had their copper foils etched to test for resistance to etching, peelability, and other coating properties. The results are shown in Table 2.

placed under a load of 1 kg. This property was reported by the highest hardness which inflicted no dent on the coating. The pencils used for this test were "Mitsubishi Hi-Uni" (made by Mitsubhishi Pencil Co., Ltd.). Resistance to etching liquid:

A given test piece, after development, was subjected to etching of 35-μm copper foil under the conditions of spray pressure of 1.7 kg/cm² and liquid temperature of 50° C. until complete etching. The time for complete etching was clocked. The coating exposed to the etching liquid was visually examined with respect to condition of coating and rated on the following four-point scale, wherein ⊚: Total absence of change
○: Slight rise of coating along the edges
Δ: Separation of coating along the edges
x: Complete separation of the whole coating Peelability:

A given test piece, after etching, was left standing under the conditions of spray pressure of 2 kg/cm² and liquid temperature of 40° C. The time required for complete separation was clocked.

TABLE 2

| | | Conditions | | Film properties after development | | | | |
|---|---|---|---|---|---|---|---|---|
| | | Exposure time to ultraviolet light (in seconds) | Developing time*1 (in seconds) | Adhesiveness | Hardness | Resistance to etching liquid | | Peelability *2 |
| | | | | | | Copper chloride | Iron chloride | |
| Example | 1-E | 60 | 60 | ○ | H | ⊚ | ○ | ⊚ |
| | 2-E | " | " | ○ | H | ⊚ | ⊚ | ○ |
| | 3-E | " | " | ○ | F | ⊚ | ⊚ | Δ |
| | 4-E | 30 | 90 | ○ | 2H | ⊚ | ⊚ | Δ |
| | 5-E | " | " | ○ | H | ⊚ | ⊚ | ○ |
| | 6-E | " | " | ○ | 2H | ⊚ | ⊚ | ○ |
| | 7-E | 90 | " | ○ | F | ○ | ○ | Δ |
| | 8-E | 30 | 30 | ○ | 2H | ⊚ | ⊚ | ○ |
| Comparative Experiment | 1-E | 180 | 60 | x | F | Δ | Δ | Δ |
| | 2-E | 120 | 90 | Δ | HB | ○ | ○ | x |
| | 3-E | 120 | " | ~Δ | B | Δ | Δ | ○ |
| | 4-E | 180 | 120 | Δ | F | ○ | ○ | Δ |

*1 The developing liquid was a weakly alkaline aqueous solution (aqueous 1% sodium carbonate solution) in the case of examples and Eterna IR in the case of comparative experiments.
*2 The peeling liquid was a strongly alkaline aqueous solution (an aqueous 5% sodium hydroxide solution at 50° C.) in the case of examples and methylene chloride in the case of comparative experiments.

The marks indicated in Table 2 as results of rating of properties are based on the following scales. Adhesiveness:

In a given test piece, cross cuts were inserted after the pattern of a checkerboard in accordance with the testing method of JIS D-0202. The test piece was then subjected to a peeling test with a cellophane tape and examined visually with respect to separation of cut squares and rated on the following four-point scale, wherein ⊚: Total absence of change (100/100)
○: Slight peeling along cut edges (100/100)
Δ: 50/100 to 90/100
x: 0/100 to 50/100 Pencil hardness:

In accordance with the testing method of JIS K-5400 using a pencil hardness tester, a given test piece was ⊚: Separation obtained within 30 seconds
○: Separation obtained after 30 to 60 seconds' standing
Δ: Separation obtained after 1 to 3 minutes' standing
x: Separation obtained after more than 3 minutes' standing

TEST EXAMPLE 5 (COATING PROPERTIES AS SOLDER RESIST)

The test pieces, 1S through 7S and Comparison 1-S through Comparison 4-S, produced in Examples 1–7 and Comparative Experiments 1–4 were exposed to light, developed, and heated at 140° C. for 60 minutes. The completely cured solder resists Consequently formed were tested for coating properties. The results are shown in Table 3.

TABLE 3

| | | Conditions | | Coating properties after after-heating | | | | | | | | | |
|---|---|---|---|---|---|---|---|---|---|---|---|---|---|
| | | Exposure time to ultra-violet light (sec.) | Develop-ing time (sec.) | Adhe-siveness | Hard-ness | Resistance to heat of soldering | | | Resist-ance to solvents | Resist-ance to acids | Resist-ance to plating | Insulation resistance (Ω) | |
| | | | | | | 1st cycle | 2nd cycle | 3rd cycle | | | | Normal state | After absorption of moisture |
| Example | 1-S | 60 | 60 | ⊚ | 5H | ⊚ | ⊚ | ○ | ⊚ | ⊚ | ○ | $4.2 \times 10^{13}$ | $7.8 \times 10^{12}$ |
| | 2-S | " | " | ⊚ | 6H | ⊚ | ⊚ | ○ | ⊚ | ⊚ | ○ | $6.7 \times 10^{13}$ | $5.6 \times 10^{12}$ |
| | 3-S | " | " | ⊚ | 4H | ⊚ | ⊚ | ⊚ | ⊚ | ⊚ | ⊚ | $6.3 \times 10^{13}$ | $8.8 \times 10^{12}$ |
| | 4-S | 30 | 90 | ⊚ | 7H | ⊚ | ⊚ | ⊚ | ⊚ | ⊚ | ⊚ | $1.2 \times 10^{14}$ | $2.7 \times 10^{13}$ |
| | 5-S | " | " | ⊚ | 5H | ⊚ | ⊚ | ○ | ⊚ | ⊚ | ⊚ | $8.9 \times 10^{13}$ | $1.4 \times 10^{13}$ |
| | 6-S | " | " | ⊚ | 7H | ⊚ | ⊚ | ⊚ | ⊚ | ⊚ | ○ | $1.1 \times 10^{14}$ | $9.5 \times 10^{12}$ |
| | 7-S | 90 | " | ⊚ | 3H | ⊚ | ⊚ | ○ | ⊚ | ⊚ | ⊚ | $5.5 \times 10^{13}$ | $4.6 \times 10^{12}$ |
| Comparative Experiment | 1-S | 180 | 60 | △ | 4H | ○ | x | x | △ | x | x | $2.3 \times 10^{13}$ | $7.1 \times 10^{11}$ |
| | 2-S | 120 | 90 | ⊚ | 2H | △ | x | x | ○ | △ | △ | $8.7 \times 10^{12}$ | $5.6 \times 10^{11}$ |
| | 3-S | " | 120 | ○ | 2H | ○ | x | x | ○ | △ | △ | $4.9 \times 10^{12}$ | $6.9 \times 10^{10}$ |
| | 4-S | 180 | " | ○ | 4H | ⊚ | ○ | x | ⊚ | ○ | ○ | $4.2 \times 10^{13}$ | $3.3 \times 10^{12}$ |

The marks indicated in Table 3 as results of rating of properties are based on the following scales. The scales used for rating adhesiveness and hardness were the same as those of Table 2. Resistance to heat of soldering:

In accordance with the testing method of JIS C-6481, a given test piece was left flowing on a solder bath for 1, 3, and 6 cycles each of 10 seconds. After the floating, the test piece was examined with respect to "blister" and adhesiveness and rated synthetically.

⊚: Total absence of change
○: Very slight perceivable change
△: Peeling on not more than 10% of coated surface
x: Peeling on entire coated surface Resistance to solvents:

A given test piece was immersed in methylethyl ketone at 20° C. for 1 hour, then examined with respect to condition of coating and adhesiveness, and rated synthetically on the following four-point scale, wherein ⊚: Total absence of change
○: Very slight perceivable change
△: Conspicuous change
x: Swelled and separated coating Resistance to acids:

A given test piece was immersed in an aqueous solution of 10% by weight of hydrochloric acid at 20° C. for 30 minutes and then examines with respect to condition of coating and adhesiveness and rated synthetically on the following four-point scale, wherein ⊚: Total absence of perceivable change
○: Very slight perceivable change
△: Conspicuous change
x: Swelled and separated coating Resistance to gold plating:

In a bath of "Autronex CI" (gold plating liquid made by Sel-Rex Corp. of the U.S.A.), a given test piece was subjected to gold plating at a current density of 1 A/dm² for 12 minutes to have gold deposited thereon in a thickness of 2 μm. The coating was subjected to a peeling test using a cellophane tape, visually examined with respect to separation of coating, and rated on the following four-point scale, wherein ⊚: Total absence of separation
○: Very slight separation
△: Separation of 10 to 50% of the whole coating
x: Separation of the whole coating Insulation resistance:

In accordance with the method of JIS Z-3197, a given test piece was tested for insulation in normal state and, after 500 hours' standing for absorption of moisture under the conditions of 55° C. and 95% RH, tested for insulation with the aid of "TR-8601" (product of Takeda Riken co., Ltd.). The results obtained in 1 minute at DC 500 V were reported.

TEST EXAMPLE 6 (RESOLUTION)

Methods used for the formation of a circuit pattern were tested with respect to resolution. The method of non-contact exposure (using Test piece 2-S of Example 2), the method of contact exposure (using Test piece 5-S of Example 5), and the method of screen printing (using Comparison Test piece 1-S of Comparative Experiment 1) were tried. In the case of the method of non-contact exposure, the surface of the substrate and the exposure film (mask) were separated by a gap of 500 μm.

As an instrument for measuring the resolution, a tool maker's microscope (Model STM, 150 magnifications, made by Olympus Optical Co., Ltd.) was used. A ridge, Wb, and a groove, Wa, in the cross section of a circuit pattern(ink) 1 formed by exposure and development on a substrate (glass epoxy substrate or glass epoxy substrate coated with a copper foil) 2 as illustrated in the accompanying drawing were measured. The measured values were compared with the corresponding dimensions of the pattern in the mask. The results are shown in Table 4.

TABLE 4

| Method of pattern formation | Part of measurement | Surface of substrate | Width of exposure film pattern (μm) | | | | |
|---|---|---|---|---|---|---|---|
| | | | 250 | 200 | 150 | 100 | 75 |
| Non-contact exposure | Groove Wa | G-E*1 | 203.6 | 154.6 | 102 | 51.8 | — |
| | | Cu*2 | 209.6 | 158.8 | 105.8 | 48 | — |
| | Ridge, Wb | G-E | 291 | 242.4 | 192.4 | 151.8 | — |
| | | Cu | 290.2 | 239.8 | 189.8 | 140.8 | — |
| Contact exposure | Groove, Wa | G-E | 256.1 | 202.7 | 147.6 | 92.2 | 66.2 |
| | | Cu | 245.4 | 194.1 | 144.2 | 95.4 | 69.7 |
| | Redge, Wb | G-E | 247.4 | 196.6 | 153.5 | 108.2 | 83.4 |
| | | Cu | 254.3 | 203.3 | 152.8 | 104.3 | 82.2 |

TABLE 4-continued

| Method of pattern formation | Part of measurement | Surface of substrate | Width of exposure film pattern (μm) | | | | |
| --- | --- | --- | --- | --- | --- | --- | --- |
| | | | 250 | 200 | 150 | 100 | 75 |
| Screen printing | Groove, Wa | G-E | — | — | — | — | — |
| | | cu | 91.7 | 37.4 | — | — | — |
| | Ridge, Wb | G-E | — | — | — | — | — |
| | | Cu | 412.7 | 352.3 | — | — | — |

*1 G-E: Pattern exposed on glass expoxy substrate
*2 Cu: Pattern exposed on copper foil

What we claim is:

1. A photosetting and thermosetting liquid resist ink composition developable with a dilute alkaline aqueous solution, which comprises in combination: a photosetting resin composition comprising
   (A) a resin curable with an activated energy ray, which has an acid value in the range of 50 to 165 mg KOH/g and is obtained by the reaction of (a) a saturated or unsaturated polybasic acid anhydride with (b) a reaction product of a novolak epoxy compound and an unsaturated monocarboxylic acid in a proportion of 0.95 to 1.05 equivalent weight of said unsaturated monocarboxylic acid to 1 equivalent weight of said novolak epoxy compound,
   (B) a photopolymerization initiator, and
   (C) a diluent and an epoxy compound containing at least two epoxy groups in one molecule thereof as a thermosetting component.

2. A composition according to claim 1, wherein said thermosetting component is contained in combination with an epoxy curing promoter.

3. A composition according to claim 1, wherein said thermosetting component is in an organic solvent solution and additionally contains a filler.

4. A composition according to claim 1, wherein said thermosetting component is used in a proportion in the range of from 10 to 150 parts by weight, based on 100 parts by weight of said photosetting resin composition.

5. A composition according to claim 1, wherein said resin curable with an activated energy ray is produced by the reaction of said saturated or unsaturated polybasic acid anhydride of an amount of not less than 0.15 mol per each of the hydroxyl groups possessed by said product of the reaction of a novolak epoxy compound and an unsaturated monocarboxylic acid.

6. A composition according to claim 1, wherein said novolak type epoxy compound is a product of the reaction of a phenol novolak or cresol novolak resin and epichlorohydrin.

7. A composition according to claim 1, wherein said unsaturated monocarboxylic acid is acrylic acid or methacrylic acid.

8. A composition according to claim 1, wherein said acid anhydride is a dibasic acid anhydride, an aromatic polycarboxylic anhydride, or a polycarboxylic anhydride.

9. A composition according to claim 1, wherein said photopolymerization initiator is used in combination with a photopolymerization accelerator.

10. A composition according to claim 1, wherein said photopolymerization initiator is used in a proportion in the range of from 0.2 to 30 parts by weight, based on 100 parts by weight of said resin curable with an activated energy ray.

11. A composition according to claim 1, wherein said diluent is a photopolymerizable monomer or an organic solvent and is used in a proportion in the range of from 30 to 300 parts by weight, based on 100 parts by weight of said resin curable with an activated energy ray.

12. A composition according to claim 11, wherein said photopolymerizable monomer is a water-soluble monomer of an $\alpha,\beta$-unsaturated compound possessing a hydrophilic group.

13. A composition according to claim 11, wherein said water-soluble monomer is one member selected from the group consisting of hydroxyalkyl acrylates or methacrylates, acrylamides, aminoalkyl acrylates or methacrylates, polyethylene glycol mono- and di-acrylates or methacrylates, and N-vinyl pyrrolidone.

14. A composition according to claim 11, wherein said photopolymerizable monomer is a polyol polyacrylate of polymerthacrylate or a polyester of a polybasic acid with a hydroxyalkyl acrylate or methacrylate.

15. A composition according to claim 1, wherein said photosetting resin composition additionally contains an inorganic filler, a pigment, a defoaming agent, a leveling agent, or a polymerization inhibitor.

* * * * *

REEXAMINATION CERTIFICATE (2243rd)

United States Patent [19]

Kamayachi et al.

[11] B1 5,009,982

[45] Certificate Issued  Mar. 15, 1994

[54] RESIST INK COMPOSITION

[75] Inventors: Yuichi Kamayachi, Wako; Syoji Inagaki, Takado, both of Japan

[73] Assignee: Taiyo Ink Manufacturing Co., Ltd., Tokyo, Japan

Reexamination Request:
No. 90/002,935, Jan. 14, 1993

Reexamination Certificate for:
Patent No.: 5,009,982
Issued: Apr. 23, 1991
Appl. No.: 204,927
Filed: Jun. 6, 1988

Related U.S. Application Data

[63] Continuation of Ser. No. 850,220, Apr. 10, 1986, abandoned.

[30]  Foreign Application Priority Data

Apr. 19, 1985 [JP]  Japan ................ 60-084987

[51] Int. Cl.$^5$ .............. G03F 7/031; G03F 7/032; C08G 59/02; C08L 63/10
[52] U.S. Cl. .................... 430/280; 430/285; 430/287; 522/14; 522/16; 522/26; 522/28; 522/81; 522/83; 522/100; 522/101; 522/103; 525/482; 525/922
[58] Field of Search ........................... 430/280

[56]  References Cited

U.S. PATENT DOCUMENTS

| | | | |
|---|---|---|---|
| 3,923,523 | 12/1975 | Nishikubo et al. | 522/103 |
| 4,072,592 | 2/1978 | Due et al. | 204/159.15 |
| 4,085,018 | 4/1978 | Ariga et al. | 522/103 |
| 4,230,793 | 10/1980 | Losert et al. | 430/315 |
| 4,390,615 | 6/1983 | Courtney et al. | 430/280 |
| 4,436,806 | 3/1984 | Rendulic et al. | 430/281 |
| 4,485,166 | 11/1984 | Herwig et al. | 430/260 |
| 4,499,163 | 2/1985 | Ishimaru et al. | 430/284 |
| 4,544,623 | 10/1985 | Audykowski et al. | 430/280 |
| 4,551,215 | 11/1985 | Sakamoto et al. | 204/159.23 |

FOREIGN PATENT DOCUMENTS

| | | |
|---|---|---|
| 1166880 | 5/1984 | Canada . |
| 48-73148 | 10/1973 | Japan . |
| 49-54487 | 5/1974 | Japan . |
| 50-83760 | 7/1975 | Japan . |
| 57-55914 | 4/1982 | Japan . |
| 57-164595 | 10/1982 | Japan . |
| 58-62636 | 4/1983 | Japan . |
| 1271309 | 4/1972 | United Kingdom . |
| 1382485 | 2/1975 | United Kingdom . |
| 1489425 | 10/1977 | United Kingdom . |
| 1515861 | 6/1978 | United Kingdom . |
| 1550982 | 8/1979 | United Kingdom . |
| 2032939 | 5/1980 | United Kingdom . |
| 2091493 | 7/1982 | United Kingdom . |

OTHER PUBLICATIONS

PTO Translation of Japan Kokai 50-83760 of Jul. 1975 to Nishikubo, PTO Reference 93-3252.
PTO Translation of Japan Kokai 48-73148 of Oct. 1973 to Nagashima/Mizushima, PTO Reference 93-3253.

*Primary Examiner*—Marion McCamish

[57]  ABSTRACT

A photosetting liquid ink composition developable with a dilute alkaline aqueous solution and comprising (A) a resin curable with an activated energy ray, obtained by the reaction of a saturated or unsaturated polybasic acid anhydride with a product of the reaction of a novolak type epoxy compound and an unsaturated monocarboxylic acid, (B) a photopolymerization initiator, and (C) a diluent can be used for the production of an etching resist or a solder resist in the manufacture of a printed circuit. This composition, when combined with a thermosetting component, produces a photosetting and thermosetting liquid ink composition.

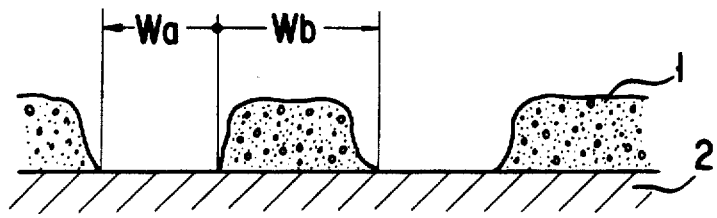

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-15 is confirmed.

* * * * *